(12) United States Patent
Zinovik et al.

(10) Patent No.: US 11,844,168 B2
(45) Date of Patent: Dec. 12, 2023

(54) INDUCTIVE HEATING DEVICE, AEROSOL-DELIVERY SYSTEM COMPRISING AN INDUCTIVE HEATING DEVICE, AND METHOD OF OPERATING SAME

(71) Applicant: Philip Morris Products S.A., Neuchatel (CH)

(72) Inventors: Ihar Nikolaevich Zinovik, Peseux (CH); Oleg Mironov, Neuchatel (CH); Oleg Fursa, Lignieres (CH)

(73) Assignee: Philip Morris Products S.A., Neuchatel (CH)

( * ) Notice: Subject to any disclaimer, the term of this patent is extended or adjusted under 35 U.S.C. 154(b) by 0 days.

(21) Appl. No.: 17/898,915

(22) Filed: Aug. 30, 2022

(65) Prior Publication Data

US 2022/0418051 A1    Dec. 29, 2022

Related U.S. Application Data

(63) Continuation of application No. 16/893,517, filed on Jun. 5, 2020, now Pat. No. 11,483,902, which is a
(Continued)

(30) Foreign Application Priority Data

May 21, 2014   (EP) ..................... 14169191

(51) Int. Cl.
  *H05B 6/06*  (2006.01)
  *H05B 6/36*  (2006.01)
  (Continued)

(52) U.S. Cl.
  CPC ............. *H05B 6/06* (2013.01); *A24F 40/46* (2020.01); *A24F 40/465* (2020.01); *A24F 40/53* (2020.01);
  (Continued)

(58) Field of Classification Search
  CPC . H05B 6/36; H05B 6/06; H05B 6/105; H05B 1/0244; H05B 6/04; H05B 6/108;
  (Continued)

(56) References Cited

U.S. PATENT DOCUMENTS 4,016,530 A   4/1977 Goll
4,457,011 A   6/1984 Hoover
(Continued)

FOREIGN PATENT DOCUMENTS

CN   1126426      7/1996
CN   1910044 A    2/2000
(Continued)

OTHER PUBLICATIONS

Serban Lungu, et al., "Simulation and Design of a Class E Power Amplifier", presented on IEEE 2009 32nd International Spring Seminars on Electronics Technology, May 2009, Brno, Czech Republic, 4 pages.
(Continued)

*Primary Examiner* — Dana Ross
*Assistant Examiner* — Kuangyue Chen
(74) *Attorney, Agent, or Firm* — Oblon, McClelland, Maier & Neustadt, L.L.P.

(57) ABSTRACT

An inductive heating device heats an aerosol-forming substrate including a susceptor. The device includes a device housing, a DC power source for providing a DC supply voltage and a DC current, power supply electronics including a DC/AC converter, the DC/AC converter including an LC load network including a series connection of a capacitor and an inductor having an ohmic resistance, a cavity in the device housing for accommodating a portion of the aerosol-forming substrate to inductively couple the inductor of the LC load network to the susceptor. The inductor is embedded in the device housing at a proximal end of the device
(Continued)

housing to surround the cavity which is also arranged at the proximal end of the device housing. A microcontroller determines from the DC supply voltage and the DC current an apparent ohmic resistance, and from the apparent ohmic resistance the temperature of the susceptor.

18 Claims, 8 Drawing Sheets

Related U.S. Application Data continuation of application No. 15/121,556, filed as application No. PCT/EP2015/061201 on May 21, 2015, now Pat. No. 10,674,763.

(51) Int. Cl.
| | | |
|---|---|---|
| H05B 6/10 | (2006.01) | |
| A24F 40/465 | (2020.01) | |
| A24F 40/46 | (2020.01) | |
| A24F 40/53 | (2020.01) | |
| H05B 6/04 | (2006.01) | |
| H05B 1/02 | (2006.01) | |
| A24F 40/20 | (2020.01) | |

(52) U.S. Cl.
CPC .............. *H05B 1/0244* (2013.01); *H05B 6/04* (2013.01); *H05B 6/105* (2013.01); *H05B 6/108* (2013.01); *H05B 6/36* (2013.01); *A24F 40/20* (2020.01); *H05B 2203/021* (2013.01); *H05B 2206/02* (2013.01); *H05B 2206/023* (2013.01)

(58) Field of Classification Search
CPC ........ H05B 2203/021; H05B 2206/023; H05B 2206/02; A24F 40/46; A24F 40/465; A24F 40/53; A24F 40/20; H03F 3/2176
See application file for complete search history.

(56) References Cited

U.S. PATENT DOCUMENTS

| | | | |
|---|---|---|---|
| 4,482,246 | A | 11/1984 | Meyer et al. |
| 4,607,323 | A | 8/1986 | Sokal |
| 5,573,613 | A | 11/1996 | Lunden |
| 5,613,505 | A | 3/1997 | Campbell |
| 5,649,554 | A | 7/1997 | Sprinkel et al. |
| 5,729,511 | A | 3/1998 | Schell |
| 6,061,257 | A | 5/2000 | Spampinato |
| 6,254,940 | B1 | 7/2001 | Pratsinis |
| 6,320,169 | B1 | 11/2001 | Clothier |
| 6,566,636 | B1 | 5/2003 | Bentley et al. |
| 6,681,998 | B2 | 1/2004 | Sharpe |
| 6,934,645 | B2 | 8/2005 | Kim |
| 7,714,649 | B1 | 5/2010 | Cripe |
| 8,362,407 | B2 | 1/2013 | Coffey |
| 8,521,442 | B2 | 8/2013 | Wang |
| 10,028,533 | B2 | 7/2018 | Fursa |
| 11,483,902 | B2 | 10/2022 | Zinovik et al. |
| 2002/0135419 | A1 | 9/2002 | Groves |
| 2004/0004071 | A1 | 1/2004 | Ogasawara |
| 2004/0149737 | A1 | 8/2004 | Sharpe |
| 2005/0270118 | A1 | 12/2005 | Shannon |
| 2006/0145761 | A1 | 7/2006 | Pribble |
| 2006/0243277 | A1 | 11/2006 | Denyer |
| 2007/0045288 | A1 | 3/2007 | Nelson |
| 2007/0114945 | A1 | 5/2007 | Mattaboni et al. |
| 2009/0016085 | A1 | 1/2009 | Rader |
| 2011/0036346 | A1 | 2/2011 | Cohen et al. |
| 2012/0018425 | A1 | 1/2012 | Lasko |
| 2012/0048266 | A1 | 3/2012 | Alelov |
| 2012/0085745 | A1 | 4/2012 | Brattoli |
| 2012/0145703 | A1 | 6/2012 | Matsen |
| 2012/0234315 | A1 | 9/2012 | Li et al. |
| 2013/0082047 | A1 | 4/2013 | Matsen |
| 2013/0277362 | A1 | 10/2013 | Ribarich |
| 2014/0020693 | A1 | 1/2014 | Cochand |
| 2014/0345633 | A1 | 11/2014 | Talon |
| 2016/0120221 | A1 | 5/2016 | Mironov |
| 2017/0055587 | A1 | 3/2017 | Zinovik |
| 2017/0079330 | A1 | 3/2017 | Mironov et al. |
| 2017/0127722 | A1 | 5/2017 | Davis |
| 2017/0201217 | A1 | 7/2017 | Waller |
| 2019/0297949 | A1 | 10/2019 | Mironov et al. |

FOREIGN PATENT DOCUMENTS

| | | |
|---|---|---|
| CN | 1549653 | 11/2004 |
| CN | 101135705 | 3/2008 |
| CN | 101390659 | 3/2009 |
| CN | 101862 | 10/2010 |
| CN | 102014677 A | 4/2011 |
| CN | 103338665 | 10/2013 |
| CN | 103689812 | 4/2014 |
| CN | 103997377 | 8/2014 |
| CN | 203762288 U | 8/2014 |
| DE | 695 21 856 T2 | 4/2002 |
| EP | 0845220 | 9/2003 |
| EP | 2444112 | 4/2012 |
| JP | 8-511175 | 10/1996 |
| JP | 3325028 | 9/2002 |
| JP | 2003-323970 A | 11/2003 |
| JP | 2013-508723 A | 3/2013 |
| JP | 2015-507477 | 3/2015 |
| KR | 10-2008-0095139 | 10/2008 |
| KR | 10-2013-0130759 | 12/2013 |
| RU | 012169 B1 | 8/2009 |
| WO | 95/27411 | 10/1995 |
| WO | WO 2006/048774 A1 | 5/2006 |
| WO | WO 2011/049846 A2 | 4/2011 |
| WO | 2011/050964 | 5/2011 |
| WO | 2012/085203 | 6/2012 |
| WO | 2013/060743 | 5/2013 |
| WO | 2013/098398 | 7/2013 |
| WO | 2015/177046 | 11/2015 |
| WO | WO 2015/177045 A1 | 11/2015 |

OTHER PUBLICATIONS

Andrei Grebennikov, et al., Switchmode RF and Microwave Power Amplifiers, Second Edition, "Class-E with Shunt Capacitance", 2012, 101 pages.
High-Efficiency Radio-Frequency Power Amplifiers, doctoral thesis of G.D. Ewing, published Jun. 1965, 71 pages.
PCT Search Report and Written Opinion for PCT/EP2015/061200 dated Aug. 25, 2015 (10 pages).
PCT International Preliminary Report on Patentability for PCT/EP2015/061200 dated May 6, 2016 (6 pages).
Bundalo et al., "DaWei Induction Heating Machine", Electronic Letters, Jul. 7, 1988, vol. 24, No. 14.
Slade, Bill, "Notes on Designing Class-E RF Power Amplifiers", May 4, 2010.
Sokal, Nathan 0. "Class-E RF Power Amplifiers", WA1HYC, Jan.-Feb. 2001.
PCT Search Report and Written Opinion for PCT/EP2015/061201 dated Aug. 26, 2015 (9 pages).
PCT International Preliminary Report on Patentability for PCT/EP2015/061201 dated May 6, 2016 (6 pages).
Shen Jinfei et al., "E-class Resonate High-Frequency DC/AC Converter", Power Electronics, vol. 36, No. 1, pp. 4-6, English translation included.
Communication Pursuant to Rule 114(2) EPC, Third Party Observations, for Application No. 15727324.4 dated Sep. 9, 2016 (8 pages).
Microchip Application Note AN850 (2002), 10 pages.
Texas Instruments Application Note AN298 (1982-2013), 12 pages.
Notice of Grounds for Rejection dated Mar. 16, 2020 in Japanese Patent Application No. 2018-231381 (with English language translation), 6 pages.

(56) References Cited

OTHER PUBLICATIONS

Extended European Search Report dated Sep. 11, 2020 in European Patent Application No. 20174413.3, 9 pages.
Indian Office Action dated Sep. 22, 2020 in Indian Patent Application No. 201617026867, 6 pages.
Nathan O. Sokai, "Class E—A New Class of High-Efficiency Tuned Single-Ended Switching Power Amplifiers," IEEE Journal of Solid-State Circuits, vol. SC-10, No. 3, XP000601709, Jun. 1975, pp. 168-176.
Japanese Office Action dated Nov. 9, 2020 in Japanese Patent Application No. 2019-212190 (submitting English translation only), 5 pages.
Russian Federation Office Action dated Feb. 8, 2022 in Russian Federation Patent Application No. 2018135084/03 (with English translation), 14 pages.
Combined Chinese Office Action and Search Report dated Aug. 12, 2021 in Patent Application No. 201910982720.5 (with English language translation), 29 pages.
Indian Post Grant Opposition dated Mar. 18, 2023 in Indian Patent Application No. 20167026867, 165 pages.
Notice of Opposition dated Jul. 14, 2023, issued in corresponding Indian patent application No. 201617026867 (23 pages).

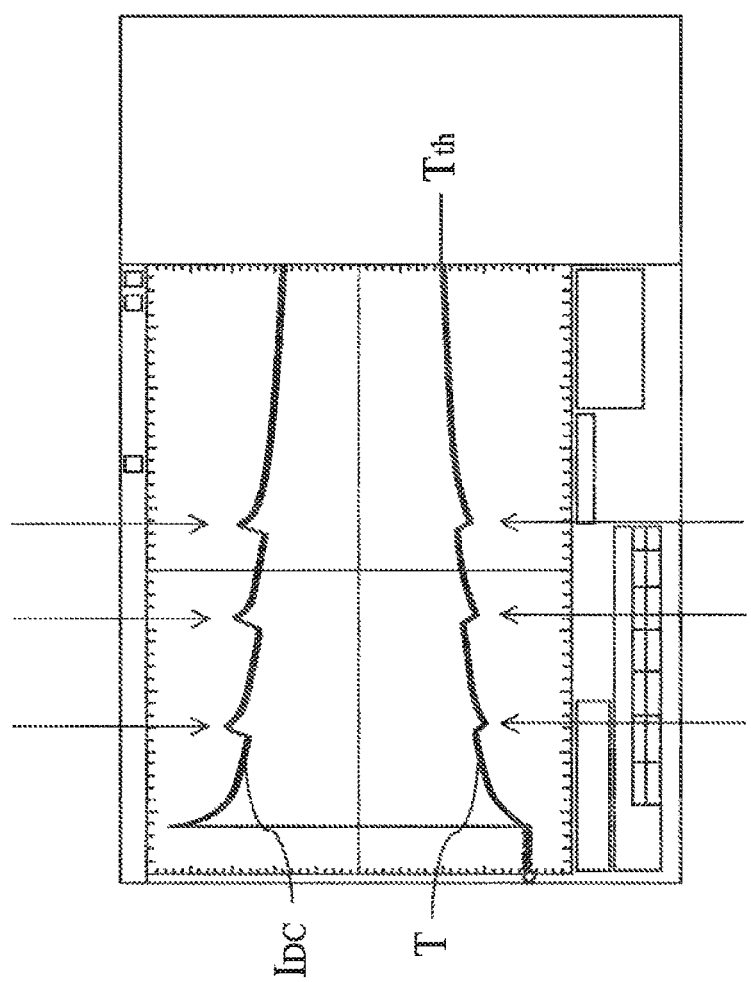

INDUCTIVE HEATING DEVICE, AEROSOL-DELIVERY SYSTEM COMPRISING AN INDUCTIVE HEATING DEVICE, AND METHOD OF OPERATING SAME

CROSS-REFERENCE TO RELATED APPLICATIONS

This application is a continuation of and claims benefit under 35 U.S.C. § 120 to U.S. application Ser. No. 16/893,517, filed Jun. 5, 2020, which is a continuation of and claims benefit under 35 U.S.C. § 120 to U.S. application Ser. No. 15/121,556, filed Aug. 25, 2016, (now U.S. Pat. No. 10,674,763) which is a U.S. National Stage application of PCT/EP2015/061201, filed May 21, 2015, and claims the benefit of priority under 35 U.S.C. § 119 to European Application No. 14169191.5, filed May 21, 2014, the entire contents of each of which are incorporated herein by reference.

TECHNICAL FIELD

The present invention relates to an inductive heating device for heating an aerosol-forming substrate. The present invention also relates to an aerosol-delivery system comprising such an inductive heating device. The present invention further relates to a method of operating such aerosol-delivery system.

DESCRIPTION OF THE RELATED ART

From the prior art aerosol-delivery systems are known which comprise an aerosol-forming substrate, typically a tobacco containing plug. To heat the tobacco plug up to a temperature at which it is capable of releasing volatile components that can form an aerosol, a heating element such as a heating blade (typically made of metal) is inserted into the tobacco plug. The temperature of the heating blade which is in direct contact with the aerosol-forming substrate (the tobacco plug) is determined as being representative of the temperature of the aerosol-forming substrate. The temperature of the heating blade is calculated using the known relationship between the ohmic resistance of the heating blade and the temperature of the heating blade. Therefore, during heating, by monitoring the ohmic resistance of the heating blade (e.g. through voltage and amperage measurements) the temperature of the heating blade can be determined at any time during a smoking run.

Other aerosol-delivery systems comprise an inductive heating device rather than a heating blade. The inductive heating device comprises an inductor arranged in thermal proximity of the aerosol-forming substrate, and the aerosol-forming substrate comprises a susceptor. The alternating magnetic field of the inductor generates eddy currents and hysteresis losses in the susceptor, causing the susceptor to heat the aerosol-forming substrate up to a temperature at which it is capable of releasing volatile components that can form an aerosol. Since the heating of the susceptor is performed in a contactless manner, there is no direct way to measure the temperature of the aerosol-forming substrate.

However, it would be desirable to be able to measure and control the operating temperature of the aerosol-forming substrate in an efficient manner, also in inductively heated aerosol-forming substrates. Thus, there is need for an inductive heating device for heating an aerosol-forming substrate, wherein temperature measurements of the aerosol-forming substrate may be achieved. There is also need of an aerosol-delivery system comprising temperature measurement of the aerosol-forming substrate.

SUMMARY

The invention suggests an inductive heating device for heating an aerosol-forming substrate comprising a susceptor. The inductive heating device according to the invention comprises:
  a device housing
  a DC power source for in operation providing a DC supply voltage and a DC current,
  a power supply electronics configured to operate at high frequency, the power supply electronics comprising a DC/AC converter connected to the DC power source, the DC/AC converter comprising an LC load network configured to operate at low ohmic load, wherein the LC load network comprises a series connection of a capacitor and an inductor having an ohmic resistance,
  a cavity arranged in the device housing, the cavity having an internal surface shaped to accommodate at least a portion of the aerosol-forming substrate, the cavity being arranged such that upon accommodation of the portion of the aerosol-forming substrate in the cavity the inductor of the LC load network is inductively coupled to the susceptor of the aerosol-forming substrate during operation.

The power supply electronics further comprises a microcontroller programmed to in operation determine from the DC supply voltage of the DC power source and from the DC current drawn from the DC power source an apparent ohmic resistance, and further programmed to in operation determine from the apparent ohmic resistance the temperature of the susceptor of the aerosol-forming substrate.

The aerosol-forming substrate is preferably a substrate capable of releasing volatile compounds that can form an aerosol. The volatile compounds are released by heating the aerosol-forming substrate. The aerosol-forming substrate may be solid or liquid or comprise both solid and liquid components. In a preferred embodiment, the aerosol-forming substrate is solid.

The aerosol-forming substrate may comprise nicotine. The nicotine containing aerosol-forming substrate may be a nicotine salt matrix. The aerosol-forming substrate may comprise plant-based material. The aerosol-forming substrate may comprise tobacco, and preferably the tobacco containing material contains volatile tobacco flavor compounds, which are released from the aerosol-forming substrate upon heating.

The aerosol-forming substrate may comprise homogenized tobacco material. Homogenized tobacco material may be formed by agglomerating particulate tobacco. Where present, the homogenized tobacco material may have an aerosol-former content of equal to or greater than 5% on a dry weight basis, and preferably between greater than 5% and 30% by weight on a dry weight basis.

The aerosol-forming substrate may alternatively comprise a non-tobacco-containing material. The aerosol-forming substrate may comprise homogenized plant-based material.

The aerosol-forming substrate may comprise at least one aerosol-former. The aerosol-former may be any suitable known compound or mixture of compounds that, in use, facilitates formation of a dense and stable aerosol and that is substantially resistant to thermal degradation at the operating temperature of the aerosol-generating device. Suitable aerosol-formers are well known in the art and include, but are not limited to: polyhydric alcohols, such as triethylene glycol, 1,3-butanediol and glycerine; esters of polyhydric alcohols, such as glycerol mono-, di- or triacetate; and aliphatic esters of mono-, di- or polycarboxylic acids, such as dimethyl dodecanedioate and dimethyl tetradecanedioate. Particularly preferred aerosol formers are polyhydric alcohols or mixtures thereof, such as triethylene glycol, 1,3-butanediol and, most preferred, glycerine. The aerosol-forming substrate may comprise other additives and ingredients, such as flavorants. The aerosol-forming substrate preferably comprises nicotine and at least one aerosol-former. In a particularly preferred embodiment, the aerosol-former is glycerine.

The DC power source generally may comprise any suitable DC power source comprising in particular a power supply unit to be connected to the mains, one or more single-use batteries, rechargeable batteries, or any other suitable DC power source capable of providing the required DC supply voltage and the required DC supply amperage. In one embodiment, the DC supply voltage of the DC power source is in the range of about 2.5 Volts to about 4.5 Volts and the DC supply amperage is in the range of about 2.5 to about 5 Amperes (corresponding to a DC supply power in the range of about 6.25 Watts and about 22.5 Watts). Preferably, the DC power source comprises rechargeable batteries. Such batteries are generally available and have an acceptable overall volume of between approximately 1.2-3.5 cubic centimeters. Such batteries may have a substantially cylindrical or rectangular solid shape. Also, the DC power source may comprise a DC feed choke.

As a general rule, whenever the term "about" is used in connection with a particular value throughout this application this is to be understood such that the value following the term "about" does not have to be exactly the particular value due to technical considerations. However, the term "about" used in connection with a particular value is always to be understood to include and also to explicitly disclose the particular value following the term "about".

The power supply electronics is configured to operate at high frequency. For the purpose of this application, the term "high frequency" is to be understood to denote a frequency ranging from about 1 Megahertz (MHz) to about 30 Megahertz (MHz), in particular from about 1 Megahertz (MHz) to about 10 MHz (including the range of 1 MHz to 10 MHz), and even more particularly from about 5 Megahertz (MHz) to about 7 Megahertz (MHz) (including the range of 5 MHz to 7 MHz).

The power supply electronics comprises a DC/AC converter connected to the DC power source.

The LC load network of the DC/AC converter (which may be embodied as a DC/AC inverter) is configured to operate at low ohmic load. The term "low ohmic load" is to be understood to denote an ohmic load smaller than about 2 Ohms. The LC load network comprises a shunt capacitor, and a series connection of a capacitor and an inductor having an ohmic resistance. This ohmic resistance of the inductor is typically a few tenths of an Ohm. In operation, the ohmic resistance of the susceptor adds to the ohmic resistance of the inductor and should be higher than the ohmic resistance of the inductor, since the supplied electrical power should be converted to heat in the susceptor to an as high extent as possible in order to increase efficiency of the power amplifier and to allow transfer of as much heat as possible from the susceptor to the rest of the aerosol-forming substrate to effectively produce the aerosol.

A susceptor is a conductor which is capable of being inductively heated. "Thermal proximity" means that the susceptor is positioned relative to the rest of the aerosol-forming substrate such that an adequate amount of heat is transferred from the susceptor to the rest of the aerosol-forming substrate to produce the aerosol.

Since the susceptor is not only magnetically permeable but also electrically conductive (it is a conductor, see above), a current known as eddy current is produced in the susceptor and flows in the susceptor according to Ohm's law. The susceptor should have low electrical resistivity ρ to increase Joule heat dissipation. In addition, the frequency of the alternating eddy current has to be considered because of the skin effect (more than 98% of the electrical current flow within a layer four times the δ from the outer surface of the conductor). Taking this into account the ohmic resistance $R_s$ of the susceptor is calculated from the equation $$R_s = \sqrt{2\pi f \mu_0 \mu_r}$$

wherein f denotes the frequency of the alternating eddy current $\mu_0$ denotes the magnetic permeability of free space $\mu_r$ denotes the relative magnetic permeability of the material of the susceptor, and ρ denotes the electrical resistivity of the material of the susceptor.

The power loss $P_e$ generated by the eddy current is calculated by the formula $$P_e = I^2 \cdot R_s$$

wherein

I denotes the amperage (rms) of the eddy current, and $R_s$ denotes the electrical ohmic resistance of the susceptor (see above)

From this equation for $P_e$ and from the calculation of $R_s$ it can be seen that for a material having a known relative magnetic permeability $\mu_r$ and a given electrical resistivity ρ it is evident that the power loss $P_e$ generated by the eddy current (through conversion to heat) increases with increasing frequency and increasing amperage (rms). On the other hand, the frequency of the alternating eddy current (and correspondingly of the alternating magnetic field inducing the eddy current in the susceptor) cannot be arbitrarily increased, since the skin depth δ decreases as the frequency of the eddy current (or of the alternating magnetic field inducing the eddy current in the susceptor) increases, so that above a certain cut-off frequency no eddy currents can be generated in the susceptor anymore since the skin depth is too small to allow eddy currents to be generated. Increasing the amperage (rms) requires an alternating magnetic field having a high magnetic flux density and thus requires voluminous induction sources (inductors).

In addition, heat is produced in the susceptor through the heating mechanism associated with hysteresis. The power loss generated by hysteresis is calculated from the equation $$P_H = V \cdot W_H \cdot f$$

wherein

V denotes the volume of the susceptor $W_H$ denotes the work required to magnetize the susceptor along a closed hysteresis loop in the B-H diagram, and f denotes the frequency of the alternating magnetic field.

The work $W_H$ required to magnetize the susceptor along a closed hysteresis loop can also be expressed as $$W_H = \oint H \cdot dB$$

The maximum possible amount of WE depends on material properties of the susceptor (saturation remanence $B_R$, coercivity $H_C$), and the actual amount of $W_H$ depends on the actual magnetization B-H loop induced in the susceptor by the alternating magnetic field, and this actual magnetization B-H loop depends on the magnitude of the magnetic excitation.

There is a third mechanism generating heat (power loss) in the susceptor. This heat generation is caused by dynamic losses of the magnetic domains in the magnetically permeable susceptor material when the susceptor is subjected to an alternating external magnetic field, and these dynamic losses also generally increase as the frequency of the alternating magnetic field increases.

To be able to generate the heat in the susceptor in accordance with the afore-described mechanisms (mainly through eddy current losses and hysteresis losses), a cavity is arranged in the device housing. The cavity has an internal surface shaped to accommodate at least a portion of the aerosol-forming substrate. The cavity is arranged such that upon accommodation of the portion of the aerosol-forming substrate in the cavity the inductor of the LC load network is inductively coupled to the susceptor of the aerosol-forming substrate during operation. This means, that the inductor of the LC load network is used to heat the susceptor through magnetic induction. This eliminates the need for additional components such as matching networks for matching the output impedance of the Class-E power amplifier to the load, thus allowing to further minimize the size of the power supply electronics.

Overall, the inductive heating device according to the invention provides for a small and easy to handle, efficient, clean and robust heating device due to the contactless heating of the substrate. For susceptors forming low ohmic loads as specified above while having an ohmic resistance significantly higher than the ohmic resistance of the inductor of the LC load network, it is thus possible to reach temperatures of the susceptor in the range of 300-400 degrees Celsius in five seconds only or in a time interval which is even less than five seconds, while at the same time the temperature of the inductor is low (due to a vast majority of the power being converted to heat in the susceptor).

As mentioned already, in accordance with one aspect of the inductive heating device according to the invention the device is configured for heating an aerosol-forming substrate of a smoking article. This comprises in particular, that power is provided to the susceptor within the aerosol-forming substrate such that the aerosol-forming substrate is heated to an average temperature of between 200-240 degrees Celsius. Even more preferably, the device is configured for heating a tobacco-laden solid aerosol-forming substrate of a smoking article.

As the aerosol-forming substrate heats up, it is desirable to control the temperature thereof. This is not easy to achieve since heating of the aerosol-forming substrate is performed by a contactless (inductive) heating of the susceptor (mainly through hysteresis losses and eddy current losses, as describe above), whereas in prior art resistive heating devices temperature control has been achieved by measuring the voltage and current at the resistive heating element due to the linear dependency of the temperature of the resistive heating element and the ohmic resistance of the heating element.

Surprisingly, in the inductive heating device according to the invention there is a strictly monotonic relationship between the temperature of the susceptor and the apparent ohmic resistance determined from the DC supply voltage of the DC power source and from the DC current drawn from the DC power source. This strictly monotonic relationship allows for an unambiguous determination of the respective temperature of the susceptor from the respective apparent ohmic resistance in the (contactless) inductive heating device according to the invention, as each single value of the apparent ohmic resistance is representative of only one single value of the temperature, there is no ambiguity in the relationship. This does not mean that the relationship of the temperature of the susceptor and the apparent ohmic resistance is necessarily linear, however, the relationship has to be strictly monotonic to avoid any ambiguous allocation of one apparent ohmic resistance to more than one temperature. The strictly monotonic relationship of the temperature of the susceptor and the apparent ohmic resistance thus allows for the determination and control of the temperature of the susceptor and thus of the aerosol-forming substrate. As will be discussed in more detail below, in case the DC/AC converter comprises a class-E amplifier the relationship between the temperature of the susceptor and the apparent ohmic resistance is linear at least for the temperature range of interest.

Determination of the DC supply voltage of the DC power source and of the DC current drawn from the DC power source comprises measurement of both the DC supply voltage and the DC current. However, in accordance with one aspect of the inductive heating device according to the invention, the DC power source may be a DC battery, in particular a rechargeable DC battery, for providing a constant DC supply voltage. This allows for recharging the batteries, preferably through a connection to the mains via a charging device comprising an AC/DC converter. In the case of supply of a constant DC supply voltage, it is still possible and may be desirable to measure the DC supply voltage, however, such measurement of the DC supply voltage is not mandatory then (as the DC supply voltage is constant). However, the power supply electronics comprises a DC current sensor for measuring the DC current drawn from the DC battery, so that the apparent ohmic resistance (which is representative of the temperature of the susceptor) can be determined from the constant DC supply voltage (regardless of whether this constant DC supply voltage is measured or is determined to have the constant value) and the measured DC current. Generally, this aspect allows for the measurement of the DC current only without the need to also measure the DC supply voltage.

As has been mentioned above, in certain instances it is possible to refrain from a measurement of the DC supply voltage, however, in accordance with one aspect of the inductive heating device according to the invention the power supply electronics comprises a DC voltage sensor for measuring the DC supply voltage of the DC power source so that determination of the actual value of the DC supply voltage can be measured in any event.

As has been discussed above, the inductive heating device according to the invention allows for a control of the temperature. To achieve this in a particularly advantageous manner, in accordance with a further aspect of the inductive heating device according to the invention the microcontroller is further programmed to interrupt generation of AC power by the DC/AC converter when the determined temperature of the susceptor of the aerosol-forming substrate is equal to or exceeds a preset threshold temperature, and in accordance with this aspect the microcontroller is programmed to resume generation of AC power when the determined temperature of the susceptor of the aerosol-forming substrate is below the preset threshold temperature again. The term "interrupt generation of AC power" is intended to cover cases in which more or less no AC power is generated as well as cases in which generation of AC power is only reduced to maintain the threshold temperature.

Advantageously, this threshold temperature is the targeted operating temperature which may be, in particular a temperature in the range of 300° C. to 400° C., for example 350° C. The inductive heating device according to the invention heats the susceptor of the aerosol-forming substrate until the susceptor has reached the preset threshold temperature corresponding to a respective apparent ohmic resistance. At that time, a further supply of AC power by the DC/AC converter is interrupted so that further heating of the susceptor is stopped and the susceptor is allowed to cool down. Once the temperature of the susceptor is below the preset threshold temperature again, this is detected by determination of a corresponding apparent ohmic resistance. At that time, generation of AC power is resumed in order to keep the temperature as close as possible to the targeted operating temperature. This can be achieved, for example, by adjusting the duty cycle of the AC power supplied to the LC load network. This is described, in principle, in WO 2014/040988.

As has already been mentioned above, in accordance with one aspect of the inductive heating device according to the invention, the DC/AC converter comprises a Class-E power amplifier comprising a transistor switch, a transistor switch driver circuit, and the LC load network configured to operate at low ohmic load, and the LC load network additionally comprises a shunt capacitor.

Class-E power amplifiers are generally known and are described in detail, for example, in the article "Class-E RF Power Amplifiers", Nathan O. Sokal, published in the bimonthly magazine QEX, edition January/February 2001, pages 9-20, of the American Radio Relay League (ARRL), Newington, CT, U.S.A. Class-E power amplifiers are advantageous as regards operation at high frequencies while at the same time having a simple circuit structure comprising a minimum number of components (e.g. only one transistor switch needed, which is advantageous over Class-D power amplifiers which comprise two transistor switches that has to be controlled at high frequency in a manner so as to make sure that one of the two transistors has been switched off at the time the other of the two transistors is switched on). In addition, Class-E power amplifiers are known for minimum power dissipation in the switching transistor during the switching transitions. Preferably, the Class-E power amplifier is a single-ended first order Class-E power amplifier having a single transistor switch only.

The transistor switch of the Class-E power amplifier can be any type of transistor and may be embodied as a bipolar-junction transistor (BJT). More preferably, however, the transistor switch is embodied as a field effect transistor (FET) such as a metal-oxide-semiconductor field effect transistor (MOSFET) or a metal-semiconductor field effect transistor (MESFET).

According to a further aspect of the inductive heating device according to the invention, the inductor of the LC load network comprises a helically wound cylindrical inductor coil which is positioned on or adjacent the internal surface of the cavity.

In accordance with another aspect of the inductive heating device according to the invention the class E power amplifier has an output impedance, and the power supply electronics further comprises a matching network for matching the output impedance of the class E power amplifier to the low ohmic load. This measure may be helpful to further increase power losses in the low ohmic load leading to an increased generation of heat in the low ohmic load. For example, the matching network may comprise a small matching transformer.

In accordance with a further aspect of the inductive heating device according to the invention, the total volume of the power supply electronics is equal to or smaller than 2 $cm^3$. This allows for an arrangement of the batteries, the power supply electronics and the cavity in a device housing having an overall small size which is convenient and easy to handle.

According to a further aspect of the inductive heating device according to the invention, the inductor of the LC load network comprises a helically wound cylindrical inductor coil which is positioned on or adjacent the internal surface of the cavity. Advantageously, the inductor coil has an oblong shape and defines an inner volume in the range of about 0.15 $cm^3$ to about 1.10 $cm^3$. For example, the inner diameter of the helically wound cylindrical inductor coil may be between about 5 mm and about 10 mm, and may preferably be about 7 mm, and the length of the helically wound cylindrical inductor coil may be between about 8 mm and about 14 mm. The diameter or the thickness of the coil wire may be between about 0.5 mm and about 1 mm, depending on whether a coil wire with a circular cross-section or a coil wire with a flat rectangular cross-section is used. The helically wound inductor coil is positioned on or adjacent the internal surface of the cavity. A helically wound cylindrical inductor coil positioned on or adjacent the internal surface of the cavity allows to further minimize the size of the device.

Yet a further aspect of the invention relates to an aerosol-delivery system comprising an inductive heating device as described above and an aerosol-forming substrate comprising a susceptor. At least a portion of the aerosol-forming substrate is to be accommodated in the cavity of the inductive heating device such that the inductor of the LC load network of the DC/AC converter of the inductive heating device is inductively coupled to the susceptor of the aerosol-forming substrate during operation.

By way of example, the aerosol-forming substrate may be an aerosol-forming substrate of a smoking article. In particular, the aerosol-forming substrate may be a tobacco-laden solid aerosol-forming substrate which may be used in smoking articles (such as, for example, cigarettes).

According to one aspect of the aerosol-delivery system according to the invention, the susceptor is made of stainless steel. For example, various grades of stainless steel can be used such as stainless steel grade 430 (SS430) or stainless steel grade 410 (SS410), stainless steel grade 420 (SS420) or stainless steel grade 440 (SS440). Other grades of stainless steel can also be used. For example, the susceptor is a single susceptor element which may be embodied as a strip, a sheet, a wire or a foil, and these susceptor elements may have different cross-sectional geometries such as rectangular, circular, elliptical, or other geometries.

In accordance with a particular aspect of the aerosol-delivery system according to the invention, the susceptor may comprises a flat strip of stainless steel, the flat strip of stainless steel having a length in a range of about 8 millimeters to about 15 millimeters, preferably a length of about 12 millimeters. The flat strip further may have a width in a range of about 3 millimeters to about 6 millimeters, preferably a width of about 4 millimeters or about 5 millimeters. The flat strip further may have a thickness in a range of about 20 micrometers to about 50 micrometers, preferably a thickness in a range of about 20 micrometers to about 40 micrometers, for example a thickness of about 25 micrometers or about 35 micrometers. One very specific embodiment of the susceptor may have a length of about 12 millimeters, a width of about 4 millimeters and a thickness of about 50 micrometers, and may be made of stainless steel grade 430 (SS430). Another very specific embodiment of the susceptor may have a length of about 12 millimeters, a width of either about 5 millimeters and a thickness of about 50 micrometers, and may be made of stainless steel grade 430 (SS430). Alternatively, these very specific embodiments may also be made from stainless steel grade 420 (SS420).

Yet another aspect of the invention relates to a method of operating an aerosol-delivery system as described above, and this method comprises the steps of:
 determining from the DC supply voltage of the DC power source and from the DC current drawn from the DC power source an apparent ohmic resistance,
 determining from the apparent ohmic resistance the temperature of the susceptor of the aerosol-forming substrate.

According to one aspect of the method according to the invention, the DC power source is a DC battery, in particular a rechargeable DC battery, and provides a constant DC supply voltage. The DC current drawn from the DC battery is measured for determining from the constant DC supply voltage and the measured DC current the apparent ohmic resistance.

In accordance with yet another aspect of the method according to the invention, the method further comprises the steps of:
 interrupting the generation of AC power by the DC/AC converter when the determined temperature of the susceptor of the aerosol-forming substrate is equal to or exceeds a preset threshold temperature, and
 resuming generation of AC power when the determined temperature of the susceptor of the aerosol-forming substrate is below the preset threshold temperature again.

As the advantages of the method according to the invention and particular aspects thereof have already been discussed above, they are not reiterated here.

BRIEF DESCRIPTION OF THE DRAWINGS

Further advantageous aspects of the invention will become apparent from the following description of embodiments with the aid of the drawings in which:
FIG. 7 shows two signals representing the DC current drawn from the DC power source vis-a-vis the temperature of the susceptor.

DETAILED DESCRIPTION

Figure 1:
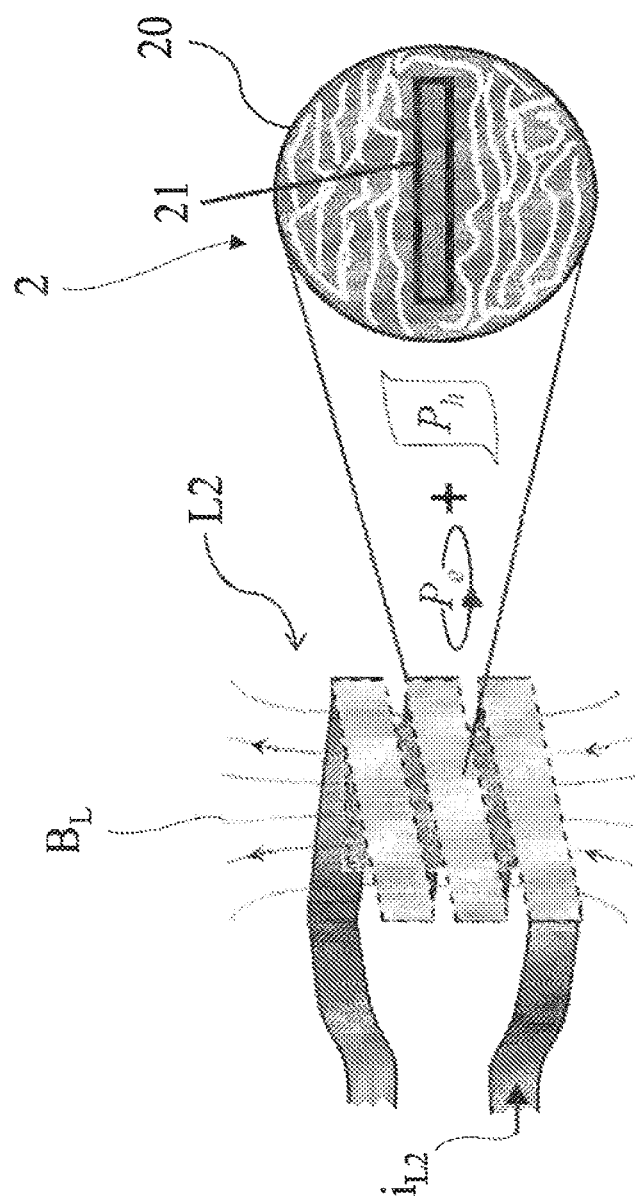
FIG. 1 shows the general heating principle underlying the inductive heating device of the invention.

In FIG. 1 the general heating principle underlying the instant invention is schematically illustrated. Schematically shown in FIG. 1 are a helically wound cylindrical inductor coil L2 having an oblong shape and defining an inner volume in which there is arranged a portion or all of an aerosol-forming substrate 20 of a smoking article 2, the aerosol-forming substrate comprising a susceptor 21. The smoking article 2 comprising the aerosol-forming substrate 20 with the susceptor 21 is schematically represented in the enlarged cross-sectional detail shown separately on the right hand side of FIG. 1. As mentioned already, the aerosol-forming substrate 20 of the smoking article 2 may be a tobacco-laden solid substrate, however, without being limited thereto.

In addition, in FIG. 1 the magnetic field within the inner volume of the inductor coil L2 is indicated schematically by a number of magnetic field lines $B_L$ at one specific moment in time, since the magnetic field generated by the alternating current $i_{L2}$ flowing through the inductor coil L2 is an alternating magnetic field changing its polarity at the frequency of the alternating current $i_{L2}$ which may be in the range of about 1 MHz to about 30 MHz (including the range of 1 MHz to 30 MHz), and may in particular be in the range of about 1 MHz to about 10 MHz (including the range of 1 MHz to 10 MHz, and may especially be smaller than 10 MHz), and very particularly the frequency may be in the range of about 5 MHz to about 7 MHz (including the range of 5 MHz to 7 MHz). The two main mechanisms responsible for generating heat in the susceptor 21, the power losses $P_e$ caused by eddy currents (closed circle representing the eddy currents) and the power losses $P_h$ caused by hysteresis (closed hysteresis curve representing the hysteresis), are also schematically indicated in FIG. 1. With respect to these mechanisms it is referred to the more detailed discussion of these mechanisms above.

Figure 2:
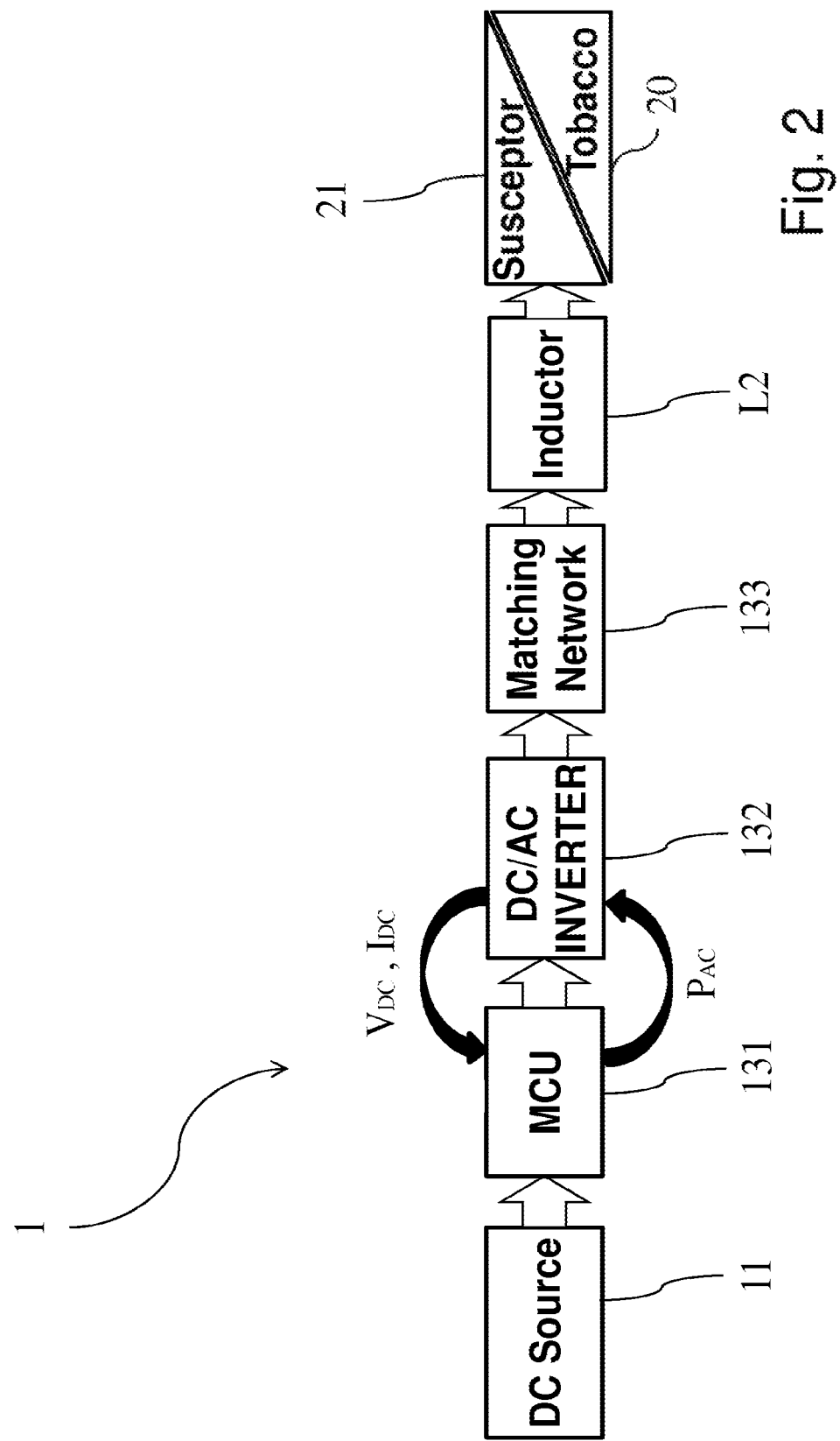
FIG. 2 shows a block diagram of an embodiment of the inductive heating device and the aerosol-delivery system according to the invention.
Figure 3:
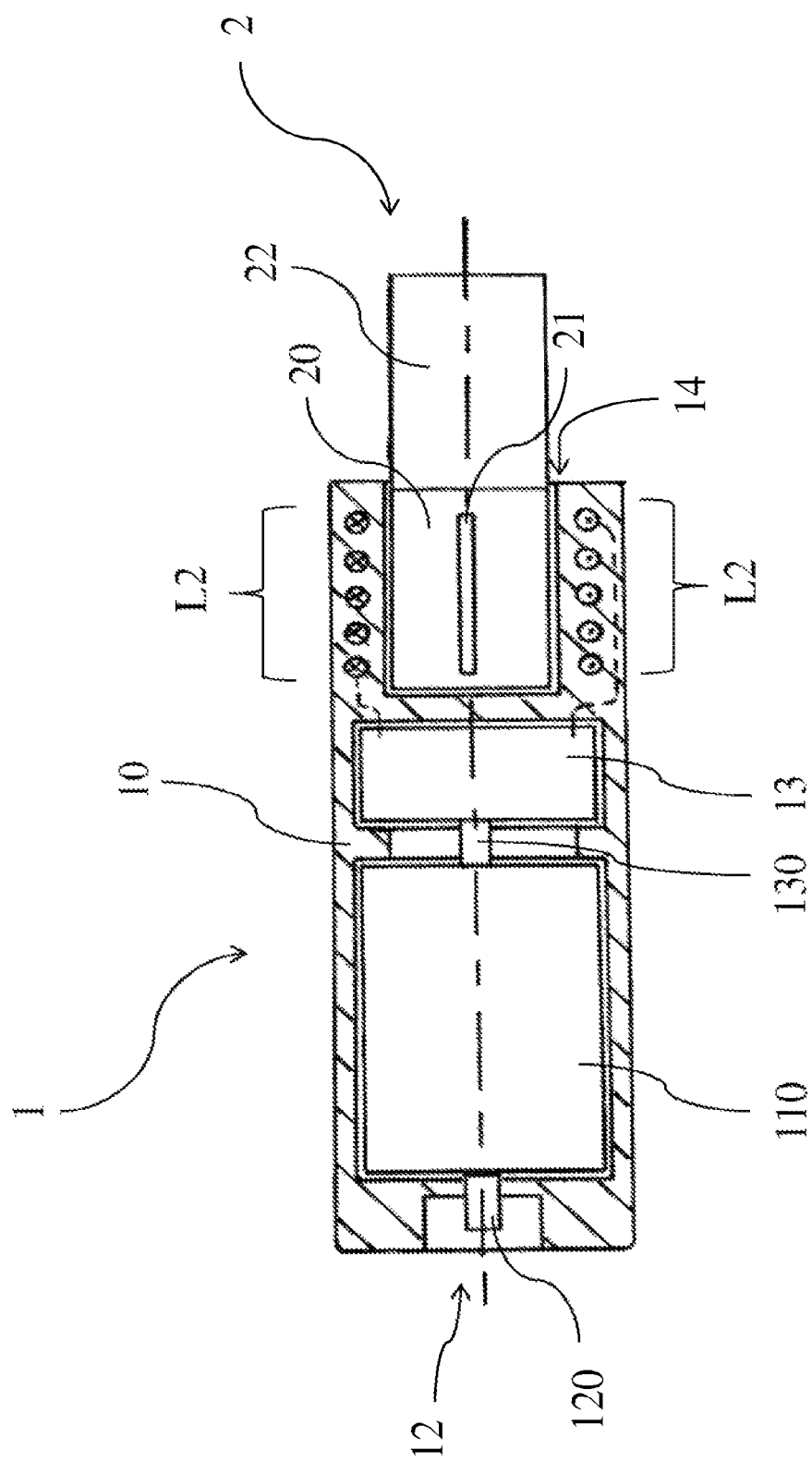
FIG. 3 shows an embodiment of the aerosol-delivery system according to the invention comprising an inductive heating device having essential components arranged in a device housing.

FIG. 3 shows an embodiment of an aerosol-delivery system according to the invention comprising an inductive heating device 1 according to the invention. The inductive heating device 1 comprises a device housing 10 which can be made of plastic, and a DC power source 11 (see FIG. 2) comprising a rechargeable battery 110. Inductive heating device 1 further comprises a docking port 12 comprising a pin 120 for docking the inductive heating device to a charging station or charging device for recharging the rechargeable battery 110. Still further, inductive heating device 1 comprises a power supply electronics 13 which is configured to operate at the desired frequency. Power supply electronics 13 is electrically connected to the rechargeable battery 110 through a suitable electrical connection 130. And while the power supply electronics 13 comprises additional components which cannot be seen in FIG. 3, it comprises in particular an LC load network (see FIG. 4) which in turn comprises an inductor L2, this being indicated by the dashed lines in FIG. 3. Inductor L2 is embedded in the device housing 10 at the proximal end of device housing 10 to surround a cavity 14 which is also arranged at the proximal end of the device housing 10. Inductor L2 may comprise a helically wound cylindrical inductor coil having an oblong shape, as shown in FIG. 5. The helically wound cylindrical inductor coil L2 may have a radius r in the range of about 5 mm to about 10 mm, and in particular the radius r may be about 7 mm. The length 1 of the helically wound cylindrical inductor coil may be in the range of about 8 mm to about 14 mm. The inner volume accordingly, may be in the range of about 0.15 cm³ to about 1.10 cm³.

Returning to FIG. 3, the tobacco-laden solid aerosol-forming substrate 20 comprising susceptor 21 is accommodated in cavity 14 at the proximal end of the device housing 10 such that during operation the inductor L2 (the helically wound cylindrical inductor coil) is inductively coupled to susceptor 21 of the tobacco-laden solid aerosol-forming substrate 20 of smoking article 2. A filter portion 22 of the smoking article 2 may be arranged outside the cavity 14 of the inductive heating device 1 so that during operation the consumer may draw the aerosol through the filter portion 22. Once the smoking article is removed from the cavity 14, the cavity 14 can be easily cleaned since except for the open distal end through which the aerosol-forming substrate 20 of the smoking article 2 is to be inserted the cavity is fully closed and surrounded by those inner walls of the plastic device housing 10 defining the cavity 14.

FIG. 2 shows a block diagram of an embodiment of the aerosol-delivery system comprising the inductive heating device 1 according to the invention, however, with some optional aspects or components as will be discussed below. Inductive heating device 1 together with the aerosol-forming substrate 20 comprising the susceptor 21 forms an embodiment of the aerosol-delivery system according to the invention. The block diagram shown in FIG. 2 is an illustration taking the manner of operation into account. As can be seen, the inductive heating device 1 comprises a DC power source 11 (in FIG. 3 comprising the rechargeable battery 110), a microcontroller (microprocessor control unit) 131, a DC/AC converter 132 (embodied as a DC/AC inverter), a matching network 133 for adaptation to the load, and the inductor L2. Microprocessor control unit 131, DC/AC converter 132 and matching network 133 as well as inductor L2 are all part of the power supply electronics 13 (see FIG. 1). The DC supply voltage $V_{DC}$ and the DC current $I_{DC}$ drawn from the DC power source 11 are provided by feed-back channels to the microprocessor control unit 131, preferably by measurement of both the DC supply voltage $V_{DC}$ and the DC current $I_{DC}$ drawn from the DC power source 11 to control the further supply of AC power to the LC load network, and in particular to inductor L2. This important aspect of the inductive heating device according to the invention will be explained in more detail below. A matching network 133 may be provided for optimum adaptation to the load but is not mandatory and is not contained in the embodiment described in more detail in the following.

Figures 4, 6:
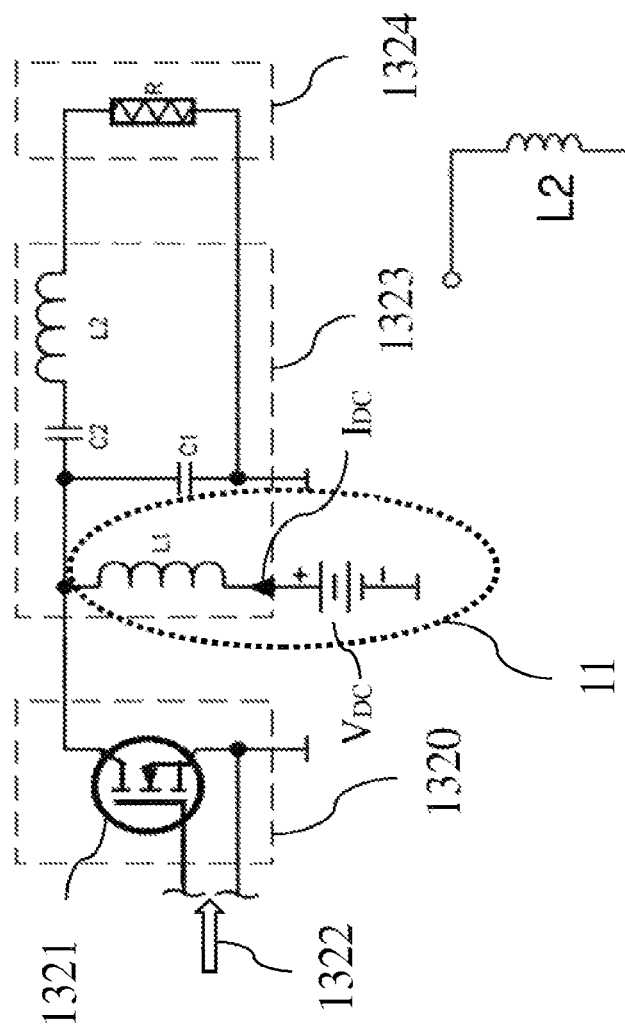
FIG. 4 shows an embodiment of essential components of the power electronics of the inductive heating device according to the invention (without matching network)
FIG. 6 shows a detail of the LC load network comprising the inductivity and ohmic resistance of the coil, and in addition shows the ohmic resistance of the load.
Figure 5:
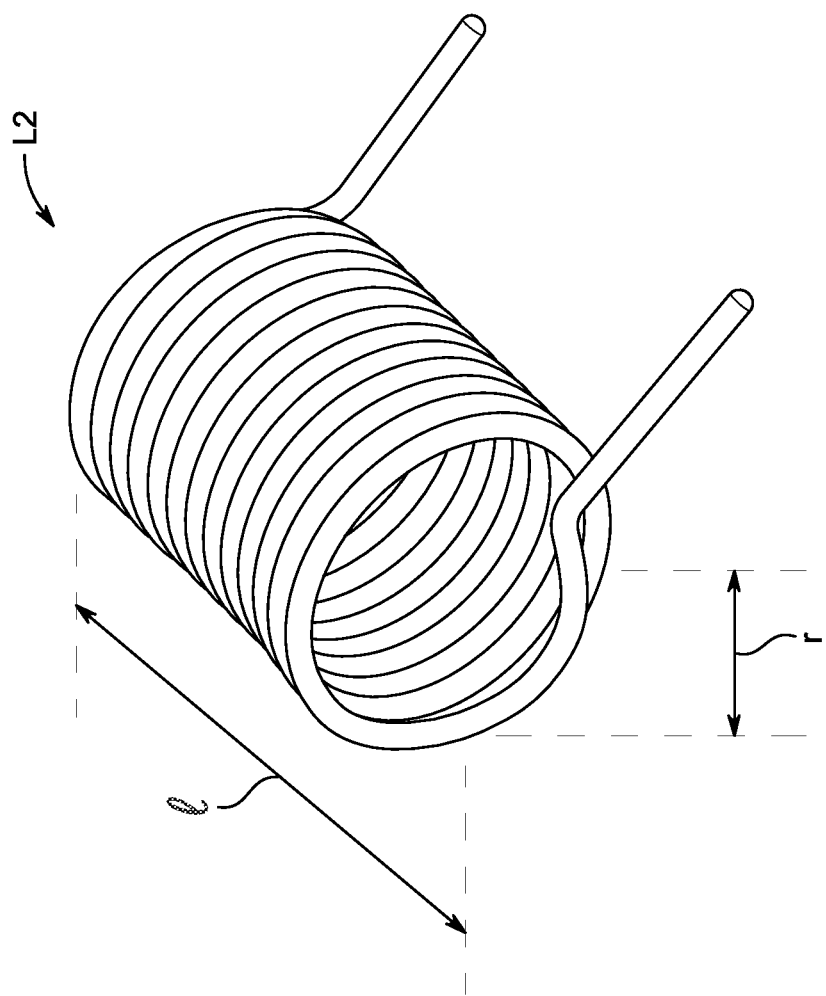
FIG. 5 shows an embodiment of the inductor of the LC load network in form of a helically wound cylindrical inductor coil having an oblong shape.

FIG. 4 shows some essential components of the power supply electronics 13, more particularly of the DC/AC converter 132. As can be seen from FIG. 4, the DC/AC converter comprises a Class-E power amplifier comprising a transistor switch 1320 comprising a Field Effect Transistor (FET) 1321, for example a Metal-Oxide-Semiconductor Field Effect Transistor (MOSFET), a transistor switch supply circuit indicated by the arrow 1322 for supplying the switching signal (gate-source voltage) to the FET 1321, and an LC load network 1323 comprising a shunt capacitor C1 and a series connection of a capacitor C2 and inductor L2. In addition, the DC power source 11 comprising a choke L1 is shown for supplying a DC supply voltage $V_{DC}$, with a DC current $I_{DC}$ being drawn from the DC power source 11 during operation. Also shown in FIG. 4 is the ohmic resistance R representing the total ohmic load 1324, which is the sum of the ohmic resistance $R_{coil}$ of the inductor L2 and the ohmic resistance $R_{load}$ of the susceptor 21, as this is shown in FIG. 6.

Due to the very low number of components the volume of the power supply electronics 13 can be kept extremely small. For example, the volume of the power supply electronics may be equal or smaller than 2 cm³. This extremely small volume of the power supply electronics is possible due to the inductor L2 of the LC load network 1323 being directly used as the inductor for the inductive coupling to the susceptor 21 of aerosol-forming substrate 20, and this small volume allows for keeping the overall dimensions of the entire inductive heating device 1 small. In case a separate inductor other than the inductor L2 is used for the inductive coupling to the susceptor 21, this would automatically increase the volume of the power supply electronics, this volume being also increased if a matching network 133 is comprised in the power supply electronics.

While the general operating principle of the Class-E power amplifier is known and described in detail in the already mentioned article "Class-E RF Power Amplifiers", Nathan O. Sokal, published in the bimonthly magazine QEX, edition January/February 2001, pages 9-20, of the American Radio Relay League (ARRL), Newington, CT, U.S.A., some general principles will be explained in the following.

Let us assume that the transistor switch supply circuit 1322 supplies a switching voltage (gate-source voltage of the FET) having a rectangular profile to FET 1321. As long as FET 1321 is conducting ("on"-state), it does essentially constitute a short circuit (low resistance) and the entire current flows through choke L1 and FET 1321. As FET 1321 is non-conducting ("off"-state), the entire current flows into the LC load network since FET 1321 essentially represents an open circuit (high resistance). Switching the transistor between these two states inverts the supplied DC voltage and DC current into an AC voltage and AC current.

For efficiently heating the susceptor 21, an as large as possible amount of the supplied DC power is to be transferred in the form of AC power to inductor L2 (helically wound cylindrical inductor coil) and subsequently to the susceptor 21 of aerosol-forming substrate 20 which is inductively coupled to inductor 2. The power dissipated in the susceptor 21 (eddy current losses, hysteresis losses) generates heat in the susceptor 21, as described further above. Or to say it in other words, power dissipation in FET 1321 has to be minimized while maximizing power dissipation in susceptor 21.

The power dissipation in FET 1321 during one period of the AC voltage/current is the product of the transistor voltage and current at each point in time during that period of the alternating voltage/current, integrated over that period, and averaged over that period. Since the FET 1321 has to sustain high voltage during a part of that period and conduct high current during a part of that period, it has to be avoided that high voltage and high current exist at the same time, since this would lead to substantial power dissipation in FET 1321. In the "on-" state of FET 1321, the transistor voltage is nearly zero when high current is flowing through the FET 1321. In the "off-" state of FET 1321, the transistor voltage is high but the current through FET 1321 is nearly zero.

The switching transitions unavoidably also extend over some fractions of the period. Nevertheless, a high voltage-current product representing a high power loss in FET 1321 can be avoided by the following additional measures. Firstly, the rise of the transistor voltage is delayed until after the current through the transistor has reduced to zero. Secondly, the transistor voltage returns to zero before the current through the transistor begins to rise. This is achieved by load network 1323 comprising shunt capacitor C1 and the series connection of capacitor C2 and inductor L2, this load network being the network between FET 1321 and the load 1324. Thirdly, the transistor voltage at turn-on time is practically zero (for a bipolar-junction transistor "BJT" it is the saturation offset voltage $V_O$). The turning-on transistor does not discharge the charged shunt capacitor C1, thus avoiding dissipating the shunt capacitor's stored energy. Fourthly, the slope of the transistor voltage is zero at turn-on time. Then, the current injected into the turning-on transistor by the load network rises smoothly from zero at a controlled moderate rate resulting in low power dissipation while the transistor conductance is building up from zero during the turn-on transition. As a result, the transistor voltage and current are never high simultaneously. The voltage and current switching transitions are time-displaced from each other.

For dimensioning the various components of the DC/AC converter 132 shown in FIG. 4, the following equations have to be considered, which are generally known and have been described in detail in the afore-mentioned article "Class-E RF Power Amplifiers", Nathan O. Sokal, published in the bimonthly magazine QEX, edition January/February 2001, pages 9-20, of the American Radio Relay League (ARRL), Newington, CT, U.S.A.

Let $Q_L$ (quality factor of the LC load circuit) be a value which is in any event greater than 1.7879 but which is a value that can be chosen by the designer (see the afore-mentioned article) let further P be the output power delivered to the resistance R, and let f be the frequency, then the various components are numerically calculated from the following equations ($V_o$ being zero for FETs, and being the saturation offset voltage for BJTs, see above):

$$L2 = Q_L \cdot R / 2\pi f$$

$$R = ((V_{cc} - V_0)^2 / P) \cdot 0.576801 \cdot (1.0000086 - 0.414395/Q_L - 0.557501/Q_L^2 + 0.205967/Q_L^3)$$

$$C1 = (1/(34.2219 \cdot f \cdot R)) \cdot (0.99866 + 0.91424/Q_L - 1.03175/Q_L^2) + 0.6/(2\pi f)^2 \cdot (L1)$$

$$C2 = (1/2\pi f R) \cdot (1/Q_L - 0.104823) \cdot (1.00121 + (1.01468/Q_L - 1.7879)) - (0.2/((2\pi f)^2 L1)))$$

This allows for a rapid heating up of a susceptor having an ohmic resistance of $R = 0.6\Omega$ to deliver approximately 7 W of power in 5-6 seconds assuming that a current of approximately 3.4 A is available using a DC power source having a maximum output voltage of 2.8 V and a maximum output current of 3.4 A, a frequency of f=5 MHz (duty ratio=50%), an inductivity of inductor L2 of approximately 500 nH and an ohmic resistance of the inductor L2 of $R_{coil} = 0.1\Omega$, an inductivity L1 of about 1 µH, and capacitances of 7 nF for capacitor C1 and of 2.2 nF for capacitor C2. The effective ohmic resistance of $R_{coil}$ and $R_{Load}$ is approximately 0.6Ω. An efficiency (Power dissipated in the susceptor 21/maximum power of DC power source 11) of about 83.5% may be obtained which is very effective.

For operation, the smoking article 2 is inserted into the cavity 14 (see FIG. 2) of the inductive heating device 1 such that the aerosol-forming substrate 20 comprising the susceptor 21 is inductively coupled to inductor 2 (e.g. the helically wound cylindrical coil). Susceptor 21 is then heated for a few seconds as described above, and then the consumer may begin drawing the aerosol through the filter 22 (of course, the smoking article does not necessarily have to comprise a filter 22).

The inductive heating device and the smoking articles can generally be distributed separately or as a kit of parts. For example, it is possible to distribute a so-called "starter kit" comprising the inductive heating device as well as a plurality of smoking articles. Once the consumer has purchased such starter kit, in the future the consumer may only purchase smoking articles that can be used with this inductive heating device of the starter kit. The inductive heating device is easy to clean and in case of rechargeable batteries as the DC power source, these rechargeable batteries are easy to be recharged using a suitable charging device that is to be connected to the docking port 12 comprising pin 120 (or the inductive heating device is to be docked to a corresponding docking station of a charging device).

Figure 8:
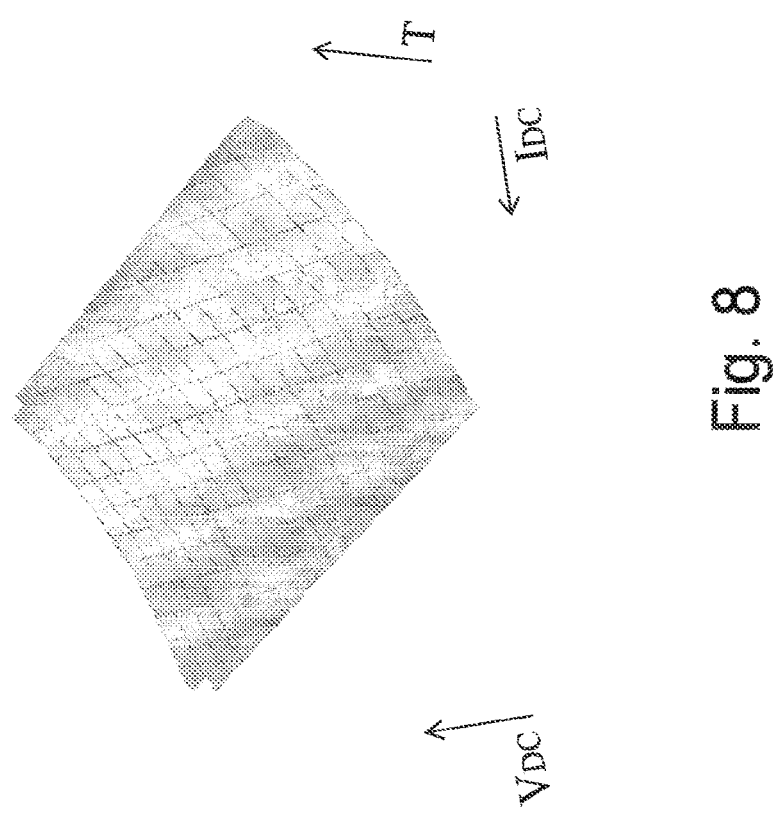
FIG. 8 shows the temperature of two susceptors vis-a-vis the DC supply voltage of the DC power source and the DC current drawn from the DC power source.
Figure 9:
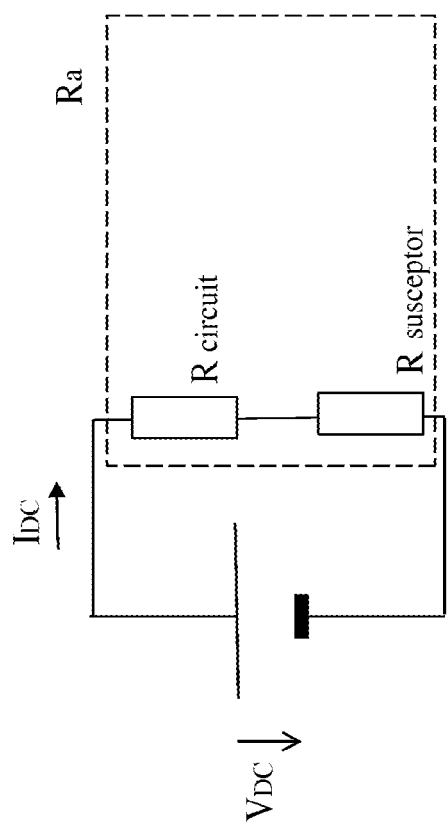
FIG. 9 shows an equivalent circuit of the power electronics of the inductive heating device.

It has already mentioned above, that by determination of the apparent ohmic resistance $R_a$ from the DC supply voltage $V_{DC}$ of the DC power source 11 and from the DC current $I_{DC}$ drawn from the DC power source 11 it is possible to determine the temperature T of the susceptor 21. This is possible because surprisingly the relationship of the temperature T of the susceptor 21 and the quotient of the DC supply voltage $V_{DC}$ and DC current $I_{DC}$ is strictly monotonic, and may even be practically linear for a Class-E amplifier. Such a strictly monotonic relationship is shown in FIG. 8 by way of example. As already mentioned, the relationship does not mandatorily have to be linear, it only has to be strictly monotonic so that for a given DC supply voltage $V_{DC}$ there is an unambiguous relationship between the respective DC current $I_{DC}$ and the temperature T of the susceptor. Or in other words, there is an unambiguous relationship between an apparent ohmic resistance $R_a$ (determined from the quotient of the DC supply voltage $V_{DC}$ and the DC current $I_{DC}$ drawn from the DC power source) and the temperature T of the susceptor. This corresponds to an equivalent circuit shown in FIG. 9 wherein $R_a$ corresponds to a series connection formed by an ohmic resistance $R_{CIRCUIT}$ (which is substantially smaller than the ohmic resistance of the susceptor) and a temperature dependent ohmic resistance $R_{SUSCEPTOR}$ of the susceptor.

As mentioned already, in case of a Class-E amplifier this strictly monotonic relationship between the apparent ohmic resistance $R_a$ and the temperature T of the susceptor is practically linear, at least for the temperature range of interest (for example for the temperature range between 100° C. and 400° C.).

If the relationship between the apparent ohmic resistance $R_a$ and the temperature T of a specific susceptor made of a specific material and having a specific geometry is known (for example, such relationship can be determined through precise measurements in the laboratory for a large number of identical susceptors and subsequent averaging of the individual measurements), this relationship between the apparent ohmic resistance $R_a$ and the temperature T of this specific susceptor can be programmed into the microcontroller 131 (see FIG. 2) so that during operation of the aerosol-delivery system only the apparent ohmic resistance $R_a$ has to be determined from the actual DC supply voltage $V_{DC}$ (typically this is the constant battery voltage) and the actual DC current $I_{DC}$ drawn from the DC power source 11. A large number of such relationships between $R_a$ and the temperature T can be programmed into the microcontroller 131 for susceptors made of different materials and having different geometries, so that during operation of the aerosol-forming device only the respective type of susceptor has to be identified and then the corresponding relationship (already programmed in the microcontroller) can be used for the determination of the temperature T of the respective type of susceptor actually used by determination of the actual DC supply voltage and the actual DC current drawn from the DC power source.

It is possible and may be preferred that both the DC supply voltage $V_{DC}$ and the DC current $I_{DC}$ drawn from the DC power source 11 can be measured (this can be achieved with a suitable DC voltage sensor and a suitable DC current sensor which can be easily integrated in the small circuit without any relevant space consumption). However, in case of a DC power source of constant supply voltage $V_{DC}$ a DC voltage sensor can be dispensed with and only a DC current sensor is needed for the measurement of the DC current $I_{DC}$ drawn from the DC power source 11.

In FIG. 7 two signals are shown representing the DC current $I_{DC}$ drawn from the DC power source 11 (upper signal) and the temperature T of the susceptor 21 (lower signal) determined from the relationship between the apparent ohmic resistance $R_a$ and the temperature T for this susceptor 21 which is programmed in the microcontroller 131.

As can be seen, once the heating of the susceptor of the aerosol-forming substrate has started, the current $I_{DC}$ is at a high level and decreases as the temperature T of the susceptor of the aerosol-forming substrate increases (the increase in temperature of the susceptor leads to an increase of $R_a$ which in turn leads to a decrease of $I_{DC}$). At different times during this heating process (in particular when the aerosol-forming substrate has reached a certain temperature), the user may take a puff from the smoking article comprising the aerosol-forming substrate with the susceptor arranged therein. At that time, air drawn in leads to a quick decrease of the temperature of the aerosol-forming substrate and of the susceptor. This leads to an decrease in the apparent ohmic resistance $R_a$, and this in turn leads to a increase in the DC current $I_{DC}$ drawn from the DC power source 11. These points in time when the user takes a puff are indicated in FIG. 7 by the respective arrows. Once the puff is finished, air is no longer drawn in and the temperature of the susceptor increases again (leading to a respective increase of the apparent ohmic resistance $R_a$) and the DC current $I_{DC}$ decreases accordingly.

As can further be seen in FIG. 7, the DC/AC converter generates AC power until the temperature of the susceptor 21 is equal to or exceeds a preset threshold temperature $T_{th}$. Once the temperature of the susceptor of the aerosol-forming substrate is equal to or exceeds this preset threshold temperature $T_{th}$ (e.g. a targeted operating temperature) the microcontroller 131 is programmed to interrupt further generation of AC power by the DC/AC converter 132. It is then desired to maintain the temperature T of the susceptor 21 at the targeted operating temperature. At the time the temperature T of the susceptor 21 is below the threshold temperature $T_{th}$ again, the microcontroller 131 is programmed to resume generation of AC power again.

This can be achieved, for example, by adjusting the duty cycle of the switching transistor. This is described in principle in WO 2014/040988. For example, during heating the DC/AC converter continuously generates alternating current that heats the susceptor, and simultaneously the DC supply voltage $V_{DC}$ and the DC current $I_{DC}$ are measured every 10 milliseconds for a period of 1 millisecond. The apparent ohmic resistance $R_a$ is determined (by the quotient of $V_{DC}$ and $I_{DC}$), and as $R_a$ reaches or exceeds a value $R_a$ corresponding to the preset threshold temperature $T_{th}$ or to a temperature exceeding the preset threshold temperature $T_{th}$ the switching transistor 1321 (see FIG. 4) is switched to a mode in which it generates pulses only every 10 milliseconds for a duration of 1 millisecond (the duty cycle of the switching transistor is only about 9% then). During this 1 millisecond On-state (conductive state) of the switching transistor 1321 the values of the DC supply voltage $V_{DC}$ and of the DC current $I_{DC}$ are measured and the apparent ohmic resistance $R_a$ is determined. As the apparent ohmic resistance $R_a$ is representative of a temperature T of the susceptor 21 which is below the preset threshold temperature $T_{th}$, the transistor is switched back to the mode mentioned above (so that the duty cycle of the switching transistor is more or less 100% again).

For example, the a susceptor 21 may have a length of about 12 millimeters, a width of about 4 millimeters and a thickness of about 50 micrometers, and may be made of stainless steel grade 430 (SS430). As an alternative example, the susceptor may have a length of about 12 millimeters, a width of either about 5 millimeters and a thickness of about 50 micrometers, and may be made of stainless steel grade 420 (SS430). These susceptor may also be made from stainless steel grade 420 (SS420).

Having described embodiments of the invention with the aid of the drawings, it is clear that many changes and modifications are conceivable without departing from the general teaching underlying the instant invention. Therefore, the scope of protection is not intended to be limited to the specific embodiments, but rather is defined by the appended claims.

The invention claimed is:

1. An inductive heating device for heating an aerosol-forming substrate, the inductive heating device comprising:
   a device housing;
   a DC power source configured to provide a DC supply voltage and a DC current;
   power supply electronics configured to operate at a frequency ranging from 1 MHz to 30 MHz, the power supply electronics comprising a DC/AC converter connected to the DC power source, the DC/AC converter comprising an LC load network configured to operate at an ohmic load smaller than 2 Ohms, wherein the LC load network comprises a series connection of a capacitor and an inductor having an ohmic resistance; and
   a cavity arranged in the device housing, the cavity having an internal surface shaped to accommodate at least a portion of the aerosol-forming substrate, the cavity being arranged such that upon accommodation of the portion of the aerosol-forming substrate in the cavity the inductor of the LC load network is inductively coupled to a susceptor positioned in thermal proximity relative to the aerosol-forming substrate during operation,
   wherein the inductor is embedded in the device housing at a proximal end of the device housing to surround the cavity which is also arranged at the proximal end of the device housing, and
   wherein the power supply electronics further comprises a microcontroller programmed to, in operation, determine from the DC supply voltage of the DC power source and from the DC current drawn from the DC power source an apparent ohmic resistance, and further programmed to, in operation, determine from the apparent ohmic resistance a temperature of the susceptor.

2. The inductive heating device according to claim 1, wherein the device is configured to heat the aerosol-forming substrate of a smoking article.

3. The inductive heating device according to claim 1,
wherein the DC power source is a DC battery configured to provide a constant DC supply voltage, and
wherein the power supply electronics further comprises a DC current sensor configured to measure a DC current drawn from the DC battery to determine from the constant DC supply voltage and the measured DC current the apparent ohmic resistance.

4. The inductive heating device according to claim 1, wherein the power supply electronics further comprises a DC voltage sensor configured to measure the DC supply voltage of the DC power source.

5. The inductive heating device according to claim 1,
wherein the microcontroller is further programmed to interrupt generation of AC power by the DC/AC converter when the determined temperature of the susceptor positioned in thermal proximity relative to the aerosol-forming substrate is equal to or exceeds a preset threshold temperature, and
wherein the microcontroller is further programmed to resume generation of AC power when the determined temperature of the susceptor positioned in thermal proximity relative to the aerosol-forming substrate is below the preset threshold temperature again.

6. The inductive heating device according to claim 1,
wherein the DC/AC converter comprises a Class-E power amplifier comprising a transistor switch, a transistor switch driver circuit, and the LC load network configured to operate at the ohmic load smaller than 2 Ohms, and
wherein the LC load network additionally comprises a shunt capacitor.

7. The inductive heating device according to claim 6,
wherein the Class-E power amplifier has an output impedance, and
wherein the power supply electronics further comprises a matching network configured to match the output impedance of the Class-E power amplifier to the ohmic load smaller than 2 Ohms.

8. The inductive heating device according to claim 1, wherein a total volume of the power supply electronics is equal to or smaller than 2 cm3.

9. The inductive heating device according to claim 1, wherein the inductor of the LC load network comprises a helically wound cylindrical inductor coil, which is disposed on or adjacent the internal surface of the cavity.

10. The inductive heating device according to claim 9, wherein the inductor coil has an oblong shape and defines an inner volume in a range of about 0.15 cm3 to about 1.10 cm3.

11. An aerosol-delivery system comprising the inductive heating device according to claim 1 and the aerosol-forming substrate, wherein at least a portion of the aerosol-forming substrate being accommodated in the cavity of the inductive heating device with a susceptor positioned in thermal proximity relative to the aerosol-forming substrate such that the inductor of the LC load network of the DC/AC converter of the inductive heating device is inductively coupled to the susceptor positioned in thermal proximity relative to the aerosol-forming substrate during operation.

12. The aerosol-delivery system according to claim 11, wherein the aerosol-forming substrate is a tobacco-laden solid aerosol-forming substrate.

13. The aerosol-delivery system according to claim 11, wherein the susceptor is made of stainless steel.

14. The aerosol-delivery system according to claim 13, wherein the susceptor comprises a flat strip of stainless steel, the flat strip of stainless steel having a length in a range of about 8 millimeters to about 15 millimeters, having a width in a range of about 3 millimeters to about 6 millimeters, and having a thickness in a range of about 20 micrometers to about 50 micrometers.

15. The aerosol-delivery system according to claim 11, wherein the susceptor is positioned within the aerosol-forming substrate during operation.

16. A method of operating the aerosol-delivery system according to claim 11, the method comprising the steps of:
determining from the DC supply voltage of the DC power source and from the DC current drawn from the DC power source the apparent ohmic resistance; and
determining from the apparent ohmic resistance the temperature of the susceptor positioned in thermal proximity relative to the aerosol-forming substrate.

17. The method according to claim 16,
wherein the DC power source is a DC battery providing a constant DC supply voltage, and
wherein the DC current drawn from the DC battery is measured for determining, from the constant DC supply voltage and the measured DC current, the apparent ohmic resistance.

18. The method according to claim 16, further comprising the steps of:
interrupting generation of AC power by the DC/AC converter when the determined temperature of the susceptor positioned in thermal proximity relative to the aerosol-forming substrate is equal to or exceeds a preset threshold temperature; and
resuming generation of AC power when the determined temperature of the susceptor positioned in thermal proximity relative to the aerosol-forming substrate is below the preset threshold temperature again.

* * * * *